United States Patent [19]
Kubota et al.

[11] Patent Number: 5,580,262
[45] Date of Patent: Dec. 3, 1996

[54] TERMINAL ADAPTER AND RELAY COMBINATION

[75] Inventors: Susumu Kubota; Masayoshi Hoshino, both of Tokyo, Japan

[73] Assignee: Tokyo Eletec Corporation, Japan

[21] Appl. No.: 339,419

[22] Filed: Nov. 14, 1994

[30] Foreign Application Priority Data

Nov. 15, 1993 [JP] Japan ................ 5-065736 U

[51] Int. Cl.⁶ .................................................. H01R 29/00
[52] U.S. Cl. ........................ 439/189; 439/69; 439/70
[58] Field of Search ............................ 439/70, 69, 49, 439/71, 72, 73

[56] References Cited

U.S. PATENT DOCUMENTS

| | | | |
|---|---|---|---|
| 4,437,718 | 3/1984 | Selinko | 439/69 X |
| 4,441,119 | 4/1984 | Link | 439/70 X |
| 4,460,236 | 7/1984 | Strautz | 439/70 X |
| 4,943,891 | 7/1990 | Ouellette | 439/49 X |

*Primary Examiner*—Samuel M. Heinrich
*Assistant Examiner*—Daniel Wittels
*Attorney, Agent, or Firm*—Adams & Wilks

[57] ABSTRACT

A multi-pin terminal adapter for connection to a printed circuit board comprises a generally rectangular substrate having a row of transversely extending guide grooves distributed in equally spaced relation over each of its four sides. A multiplicity of contact pins each extend discretely in and through the guide grooves for connection with the printed circuit board. The substrate has a cavity dimensioned to receive an integrated circuit for connection between the multi-pin terminal adapter and a relay socket which is releasably connected to the substrate.

19 Claims, 2 Drawing Sheets

5,580,262

TERMINAL ADAPTER AND RELAY COMBINATION

BACKGROUND OF THE INVENTION

1. Field of the Invention

This invention relates to a multi-pin terminal adapter for electrical connection to printed circuit boards and associated electronic parts. The invention is also directed to the combination of such an adapter with a relay socket for deriving from and adding an electrical signal to an integrated circuit and a printed circuit board.

2. Prior Art

Generally, printed circuit boards are provided with a large number of leads connected to densely packed electronic circuit elements such as resistors and capacitors as in integrated circuits. The leads are however broadly standardized under common specifications related to configuration, lead-to-lead spacing (pitch) and other design parameters so as to provide facilitated circuit assembly and enhanced productivity.

For purposes of illustration, a typical form of conventional flat-package integrated circuit is shown in FIGS. 4a and 4b, incorporating a total of 64 contact pins known as "Gull Wing" extending in a closely aligned row downwardly symmetrically from four sides of a rectangular substrate for solder connection to corresponding leads on an underlying printed circuit board which is not shown.

The design and development work on printed circuit boards would be held in abeyance pending the outcome of newly developed circuit components of a high packing density. This procedure is literally time-consuming. It is therefore desirable to carry out the development project of circuit component parts simultaneously or parallel with the design of related circuit boards, in which instance numerous signal leads are connected to extremely clouded terminal lands disposed on the printed circuit board which represent the prospective positions for mounting high-density circuit components, the signal leads being then connected to an external equivalent electronic circuitry for simulation or other testing. With such densely packed integrated circuits (IC), it has been extremely difficult, if not impossible, to locate the correct contact pin or pins for input of a predetermined signal particularly where the IC circuit is mounted closely adjacent to other circuit components, often resulting in damaged or otherwise defective ICs. Sockets have been proposed to protect costly ICs against objectionable mechanical/electrical stresses during the stage of preparation of associated printed circuit boards. However, the design of such protective sockets would not envision the compatibility of surface-mount IC with a given printed circuit board. In the industrial sector of making and supplying surface-mount integrated circuits, it has been proposed to use a single standard socket accommodating numerous ICs for performance or ageing test. Such a socket however would not be suitable for use with printed circuit boards having different geometric and performance characteristics.

SUMMARY OF THE INVENTION

It is therefore a primary object of the present invention to provide a multi-pin terminal adapter capable of accommodating a surface-mount type integrated circuit and connected to a printed circuit board for deriving electrical signals selectively from a multiplicity of leads thereon.

The invention further seeks to provide a combination of multi-pin terminal adapter and relay socket such that an electrical signal can be derived from its associated printed circuit board selectively with utmost ease and accuracy and an external signal can be easily and effectively added to a selected terminal pin on an integrated circuit interposed between the terminal adapter and the relay socket.

An advantageous aspect of the invention includes the provision of a means in the multi-pin terminal adapter for positioning and retaining a multiplicity of contact lead pins in closely spaced relationship such that discrete lead pins are held free from contact with one another to preclude short-circuiting and are readily discernible for selective connection with mating leads on a printed circuit board or an external electronic circuit.

According to another advantageous aspect of the invention, the IC circuit interposed between the terminal adapter and the relay socket can be protected against damage and readily replaced as required.

According to the invention, there is provided a multi-pin terminal adapter in combination with a relay socket which comprises a generally rectangular substrate of insulating material having a land on each of its four sides which is recessed to provide a multiplicity of equally spaced, transversely aligned guide grooves, and a multiplicity of electrical contact pins each extending discretely in and through the guide grooves, the substrate having a cavity dimensioned to receive an integrated circuit having a multiplicity of contact pins corresponding in number and position to those on the terminal adapter, and the relay socket being releasably connected to the terminal adapter.

DETAILED DESCRIPTION OF THE INVENTION

Figure 1:
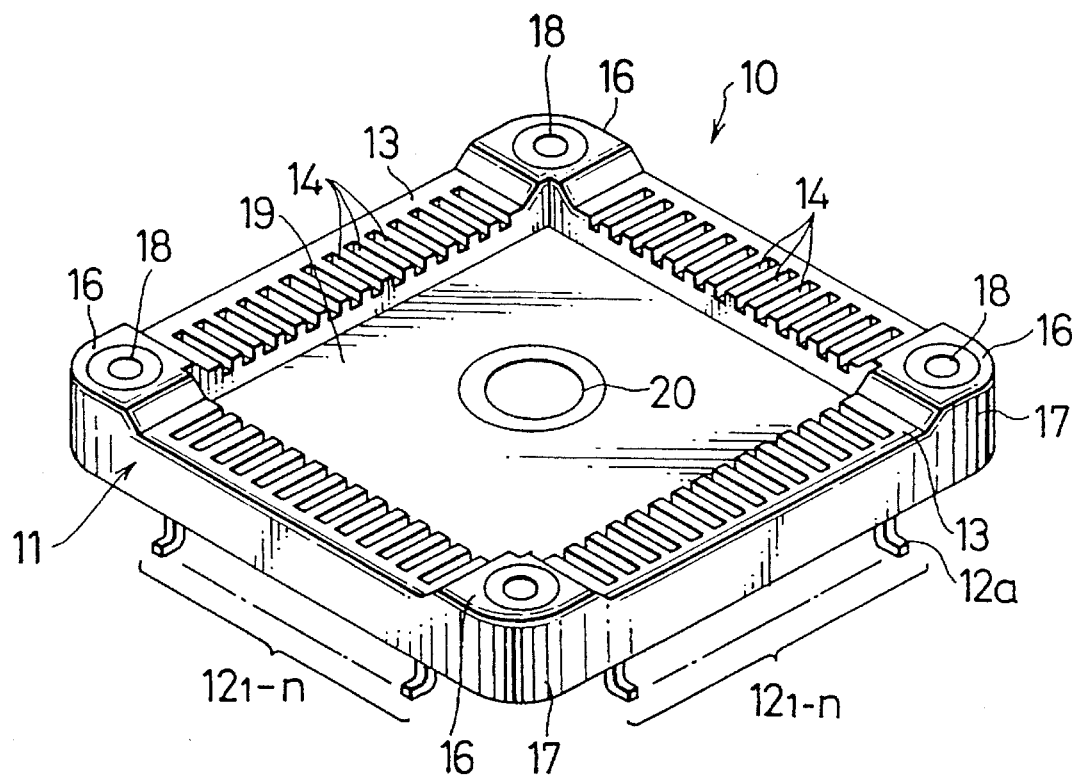
FIG. 1 is a perspective view of a multi-pin terminal adapter for connection to a printed circuit board (not shown)

Referring now to the drawings and in particular to FIG. 1, there is shown a multi-pin terminal adapter 10 embodying the invention for use with a printed circuit board. The terminal adapter 10 comprises a generally rectangular substrate 11 made of a suitable insulating material, such as for example a heat-resistant polymer, and a multiplicity of electrical contact pins $12_{(1-n)}$ extending vertically downwardly from the substrate 11 for connection as by soldering to corresponding leads on a printed circuit board (not shown). The substrate 11 has a land 13 on each of its four sides which is recessed to provide a multiplicity of equally spaced and transversely aligned grooves 14 each including through-apertures 15 for receiving the corresponding number of contact pins $12_{1-n}$. Each array of grooves 14 terminates at and between opposite corners 16 each of which is thickened to provide a support lug 17 having a threaded hole 18 for connection to a relay socket later described.

Figure 2:
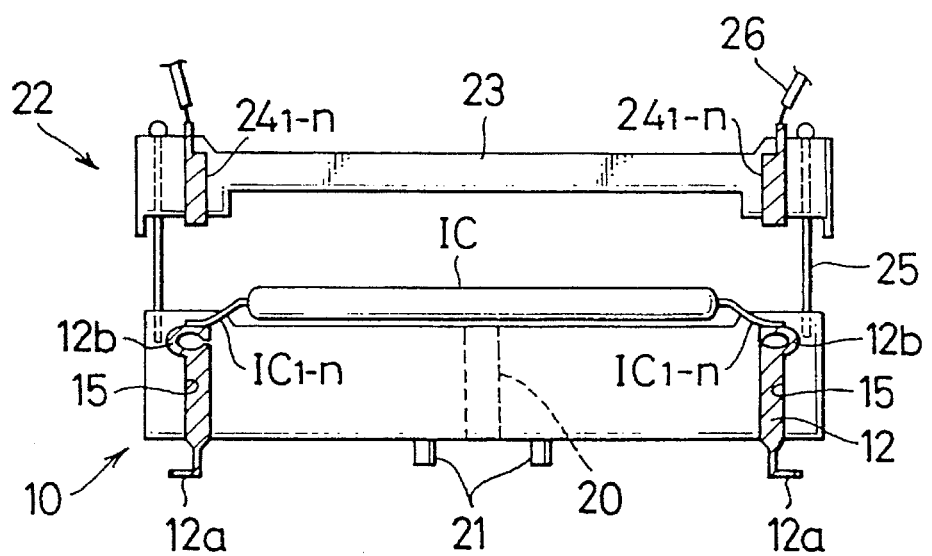
FIG. 2 is a side elevational, partly sectional, view of the terminal adapter combined with a relay socket with an integrated circuit interposed therebetween.

The substrate 11 has a square cavity 19 defined by the four respective side lands 13 and dimensioned to receive an integrated circuit IC as shown in FIG. 2. Designated at 20 is a threaded hole centrally located in the cavity 19 for engagement with a bolt (not shown) to fasten the terminal adapter to a printed circuit board (not shown). Designated at 21 are downwardly projecting positioning lugs for provisional connection of the multi-pin terminal adapter to the circuit board.

Figure 4A:
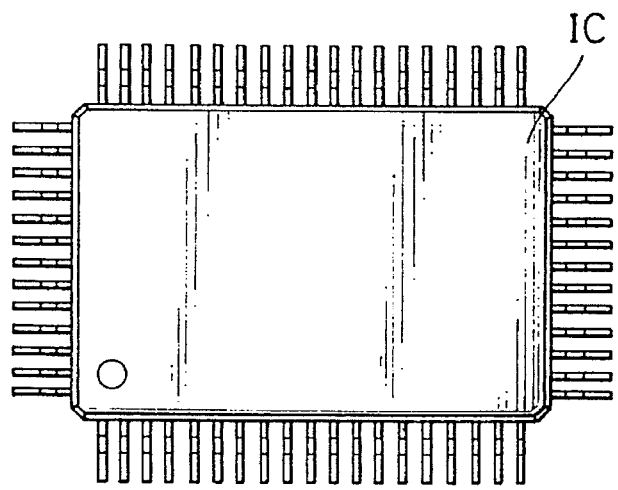
FIG. 4a is a top plan view of a conventional IC package.
Figure 4B:
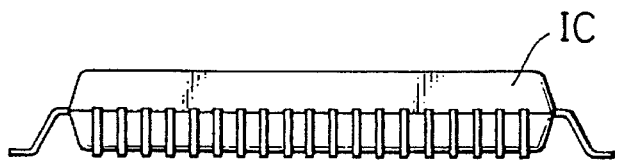
FIG. 4b is a side elevational view of the same.

As shown in FIG. 2, each of the contact pins $12_{1-n}$ has a leg 12a extending downwardly from the bottom of the substrate 11 at a level substantially flush with the distal end of the pins $12_{1-n}$ for solder connection to a mating lead on the printed circuit board, and a curled head 12b exposed through the respective groove 14 for resilient engagement with a mating connecting pin $IC_{1-n}$ on an integrated circuit IC of the type shown in FIGS. 4a and 4b in which the number and position of connecting pins $IC_{1-n}$ are in correspondence with those of contact pins $12_{1-n}$ on the multi-pin terminal adapter 10.

The relay socket designated at 22 comprises a substrate 23 substantially coextensive with the adapter substrate 11 and made of a suitable insulating material such as a glass/epoxy laminate, and a multiplicity of contact pins $24_{1-n}$ equal in number to and positioned in registry with the contact pins $12_{1-n}$ on the multi-pin terminal adapter 10. The contact pins $24_{1-n}$ on the relay socket 22 each have their lower ends projecting downwardly from the lower surface of the substrate 23 for engagement with the corresponding pins $IC_{1-n}$ on the integrated circuit IC and their upper ends exposed beyond the upper surface of the substrate 23. A clamping pin 25 extends downwardly from each of the four corners of the substrate 23 and is releasably engageable with the threaded hole 18 in the substrate 11 of the terminal adapter 10. When mounting the relay socket 22 in place on the multi-pin terminal adapter 10, it is lowered from the position shown in FIG. 2 to the position of FIG. 3 in which the respective contact pins $24_{1-n}$ on the socket 22 are brought into contact with the corresponding connesting pins $IC_{1-n}$ on the integrated circuit IC.

Figure 3:
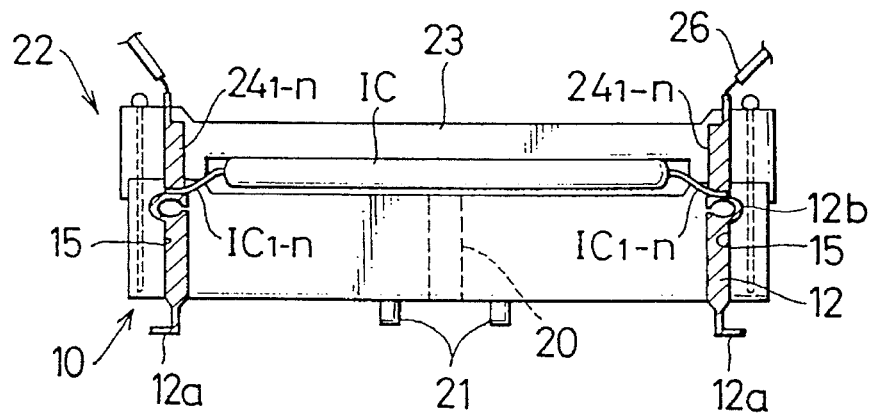
FIG. 3 is a view similar to FIG. 2 but showing the terminal leads of the relay socket connected to an external electronic circuit.

FIG. 3 illustrates an example of use of the multi-pin terminal adapter/relay socket combination shown in FIG. 2 in which the exposed upper ends of the socket terminal leads or pins $24_{1-n}$ are connected selectively through lead wires 26 to an external electronic circuit to provide signal input and output with respect to the integrated circuit IC for performance test thereof or the underlying printed circuit.

What is claimed is:

1. A multi-pin terminal adapter in combination with a relay socket releasably connected to the multi-pin terminal adapter, the multi-pin terminal adapter comprising: a generally rectangular substrate formed of an insulating material and having first and second main surfaces, the first main surface having a land on each of the sides of the substrate, each of the lands being recessed to provide a plurality of equally spaced, transversely aligned guide grooves, each of the grooves being in communication with a through-hole extending from the first main surface to the second main surface, and a plurality of electrical contact pins each having first and second ends and extending into one of the through-holes, the first end of each of the electrical contact pins being proximate the first main surface and disposed entirely within one of the guide grooves, the second end of each of the electrical contact pins extending from the second main surface for connection to a printed circuit board, the substrate having a cavity dimensioned to receive an integrated circuit having a plurality of terminal pins corresponding in number and position to the electrical contact pins.

2. A multi-pin terminal adapter in combination with a relay socket as claimed in claim 1; wherein the relay socket has a plurality of electrical contact pins corresponding in number and position to the electrical contact pins of the multi-pin terminal adapter, each of the electrical contact pins of the relay socket having a first end for electrical connection to an external electronic circuit and a second end for connection to a terminal pin of an integrated circuit.

3. A multi-pin terminal adapter in combination with a relay socket as claimed in claim 1; wherein the first end of each of the electrical contact pins of the multi-pin terminal adapter is curled for resilient engagement with a terminal pin of an integrated circuit.

4. A multi-pin terminal adapter in combination with a relay socket as claimed in claim 1; wherein the substrate has at least one through-hole extending through the cavity thereof and receptive of a connecting member for releasably connecting the substrate to a printed circuit board.

5. A multi-pin terminal adapter in combination with a relay socket as claimed in claim 4; wherein the substrate has at least one positioning member extending from the second main surface thereof for provisionally securing the substrate to a printed circuit board.

6. A multi-pin terminal adapter in combination with a relay socket as claimed in claim 1; wherein the second end of each of the electrical contact pins has a terminal portion extending substantially parallel to the second main surface of the substrate.

7. A multi-pin terminal adapter in combination with a relay socket as claimed in claim 2; wherein the relay socket further comprises a plurality of connecting members for releasably connecting the substrate to the relay socket; and wherein the substrate comprises a lug portion disposed at each intersection between the sides of the substrate, each of the lug portions having an opening for releasably receiving one of the connecting members of the relay socket.

8. In combination: a generally rectangular first substrate having first and second main surfaces, the first main surface having a land on each of the sides of the first substrate, each of the lands being recessed to provide a plurality of spaced guide grooves, each of the guide grooves being in communication with a through-hole extending from the first main surface to the second main surface, a plurality of contact pins each extending into one of the through-holes and having first and second ends, each of the first ends of the contact pins being disposed proximate the first main surface, each of the second ends of the contact pins extending from the second main surface for connection to a printed circuit board, and the first main surface having a cavity dimensioned to receive an integrated circuit having a plurality of terminal pins corresponding in number and position to the contact pins of the first substrate; a second substrate substantially coextensive with and disposed over the first main surface of the first substrate, the second substrate having a plurality of contact pins corresponding in number and positioned in registry with the contact pins of the first substrate, each of the contact pins of the second substrate having a first end for connection to an external electronic circuit, and a second end for connection to a terminal pin of an integrated circuit; and connecting means for releasably connecting the first substrate to the second substrate.

9. A combination as claimed in claim 8; wherein the first end of each of the contact pins of the first substrate is curled for resilient engagement with a terminal pin of an integrated circuit.

10. A combination as claimed in claim 9; wherein the first end of each of the contact pins of the first substrate is disposed entirely within one of the guide grooves.

11. A combination as claimed in claim 8; wherein the first end of each of the contact pins of the first substrate is disposed entirely within one of the guide grooves.

12. A combination as claimed in claim 8; wherein the connecting means comprises a plurality of threaded openings each disposed at each intersection between the sides of the first substrate, and a plurality of threaded connecting members each extending through the second substrate for threaded engagement with one of the threaded openings of the first substrate.

13. A combination as claimed in claim 8; wherein the first substrate has at least one through-hole extending through the cavity thereof which is receptive of a connecting member for releasably connecting the first substrate to a printed circuit board.

14. A combination as claimed in claim 13; wherein the first substrate has at least one positioning member extending from the second main surface thereof for provisionally securing the first substrate to a printed circuit board.

15. A multi-pin terminal adapter for electrically connecting an integrated circuit to a printed circuit board, comprising: a generally rectangular substrate having first and second main surfaces, a plurality of equally spaced guide grooves disposed around the periphery of the first main surface and defining a cavity therebetween, each of the guide grooves being in communication with a through-hole extending from the first main surface to the second main surface; and a plurality of contact pins each extending into one of the through-holes, each of the contact pins having a first end for connection to a printed circuit board and a second end, the first end of each of the contact pins being disposed entirely within one of the guide grooves, the cavity of the substrate being dimensioned to receive an integrated circuit having a plurality of terminal pins corresponding in number and position to the contact pins for connection to a printed circuit board.

16. A multi-pin terminal adapter as claimed in claim 15; wherein the second end of each of the contact pins is curled for resilient engagement with a terminal pin of an integrated circuit.

17. A multi-pin terminal adapter as claimed in claim 16; wherein the first end of each of the contact pins has a terminal portion extending substantially parallel to the second main surface of the substrate.

18. A multi-pin terminal adapter as claimed in claim 15; wherein the substrate has at least one through-hole extending through the cavity thereof and which is receptive of a connecting member for releasably connecting the substrate to a printed circuit board.

19. A multi-pin terminal adapter as claimed in claim 18; wherein the substrate has at least one positioning member extending from the second main surface thereof for provisionally securing the substrate to a printed circuit board.

* * * * *